United States Patent
Borthakur et al.

(10) Patent No.: US 9,741,762 B2
(45) Date of Patent: Aug. 22, 2017

(54) SEMICONDUCTOR DEVICES AND METHODS FOR FORMING PATTERNED RADIATION BLOCKING ON A SEMICONDUCTOR DEVICE

(71) Applicant: Micron Technology, Inc., Boise, ID (US)

(72) Inventors: Swarnal Borthakur, Boise, ID (US); Marc Sulfridge, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/716,628

(22) Filed: May 19, 2015

(65) Prior Publication Data

US 2015/0255502 A1      Sep. 10, 2015

Related U.S. Application Data

(62) Division of application No. 13/924,098, filed on Jun. 21, 2013, now Pat. No. 9,064,984, which is a division
(Continued)

(51) Int. Cl.
*H01L 21/00* (2006.01)
*H01L 27/146* (2006.01)
(Continued)

(52) U.S. Cl.
CPC ........ *H01L 27/14685* (2013.01); *H01L 24/10* (2013.01); *H01L 24/13* (2013.01);
(Continued)

(58) Field of Classification Search
CPC  H01L 27/14685; H01L 27/1469; H01L 24/13
See application file for complete search history.

(56) References Cited

U.S. PATENT DOCUMENTS 5,311,061 A      5/1994   Sheck
5,580,795 A  *  12/1996   Schimert ............. H01L 27/1446
                                                                                      250/332
(Continued)

FOREIGN PATENT DOCUMENTS

CN         101308845 A      11/2008
EP           1577948 A1       9/2005
TW         200601466 A       1/2006

OTHER PUBLICATIONS

Office Action issued Jun. 9, 2014 in Taiwan Application No. 099106813, 7 pages.

*Primary Examiner* — Laura Menz
(74) *Attorney, Agent, or Firm* — Perkins Coie LLP

(57) ABSTRACT

Several embodiments for semiconductor devices and methods for forming semiconductor devices are disclosed herein. One embodiment is directed to a method for manufacturing a microelectronic imager having a die including an image sensor, an integrated circuit electrically coupled to the image sensor, and electrical connectors electrically coupled to the integrated circuit. The method can comprise covering the electrical connectors with a radiation blocking layer and forming apertures aligned with the electrical connectors through a layer of photo-resist on the radiation blocking layer. The radiation blocking layer is not photoreactive such that it cannot be patterned using radiation. The method further includes etching openings in the radiation blocking layer through the apertures of the photo-resist layer.

6 Claims, 17 Drawing Sheets

Related U.S. Application Data of application No. 13/113,638, filed on May 23, 2011, now Pat. No. 8,497,186, which is a division of application No. 12/410,343, filed on Mar. 24, 2009, now Pat. No. 7,947,601.

(51) Int. Cl.
  *H01L 23/00* (2006.01)
  *H01L 31/0216* (2014.01)

(52) U.S. Cl.
  CPC .... *H01L 27/1469* (2013.01); *H01L 27/14618* (2013.01); *H01L 27/14683* (2013.01); *H01L 31/02164* (2013.01); H01L 24/05 (2013.01); H01L 2224/02372 (2013.01); H01L 2224/0401 (2013.01); H01L 2224/05548 (2013.01); H01L 2224/13 (2013.01); H01L 2224/131 (2013.01); H01L 2224/13021 (2013.01); H01L 2924/01029 (2013.01); H01L 2924/12042 (2013.01); H01L 2924/14 (2013.01)

(56) References Cited

U.S. PATENT DOCUMENTS

| | | | |
|---|---|---|---|
| 5,851,910 A | 12/1998 | Hsu et al. | |
| 7,211,826 B2 | 5/2007 | Park et al | |
| 7,767,544 B2* | 8/2010 | Borthakur | H01L 27/14618 438/106 |
| 7,947,601 B2* | 5/2011 | Borthakur | H01L 27/14618 438/456 |
| 8,389,404 B2* | 3/2013 | Xi | H01L 21/76898 257/E21.597 |
| 8,497,186 B2* | 7/2013 | Borthakur | H01L 27/14618 438/456 |
| 9,064,984 B2* | 6/2015 | Borthakur | H01L 27/14618 |
| 2005/0258901 A1 | 11/2005 | Khorramabadi et al. | |
| 2005/0285154 A1 | 12/2005 | Akram et al. | |
| 2006/0262255 A1* | 11/2006 | Wang | G02F 1/133555 349/114 |
| 2006/0262258 A1* | 11/2006 | Wang | G02F 1/133555 349/117 |
| 2007/0052020 A1 | 3/2007 | Chen et al. | |
| 2007/0087492 A1* | 4/2007 | Yamanaka | C23C 16/24 438/166 |
| 2007/0161231 A1 | 7/2007 | Chun | |
| 2007/0170360 A1 | 7/2007 | Gooch et al. | |
| 2007/0279556 A1* | 12/2007 | Wang | G02F 1/133502 349/102 |
| 2008/0121621 A1* | 5/2008 | Stockum | C03C 15/00 216/97 |
| 2008/0251871 A1* | 10/2008 | Borthakur | H01L 27/14618 257/432 |
| 2008/0283951 A1 | 11/2008 | Nabe et al. | |
| 2009/0017576 A1* | 1/2009 | Borthakur | H01L 27/14618 438/73 |
| 2009/0110878 A1* | 4/2009 | Pratt | G03F 9/708 428/137 |
| 2009/0146234 A1* | 6/2009 | Luo | H01L 27/14618 257/432 |
| 2009/0146312 A1* | 6/2009 | Sulfridge | H01L 21/76898 257/774 |
| 2010/0244172 A1* | 9/2010 | Borthakur | H01L 27/14618 257/435 |
| 2011/0221023 A1* | 9/2011 | Borthakur | H01L 27/14618 257/435 |
| 2013/0280851 A1* | 10/2013 | Borthakur | H01L 27/14618 438/72 |
| 2015/0255502 A1* | 9/2015 | Borthakur | H01L 27/14618 438/59 |

* cited by examiner

SEMICONDUCTOR DEVICES AND METHODS FOR FORMING PATTERNED RADIATION BLOCKING ON A SEMICONDUCTOR DEVICE

CROSS-REFERENCE TO RELATED APPLICATIONS

This application is a divisional of U.S. application Ser. No. 13/924,098 filed Jun. 21, 2013, which is a divisional of U.S. application Ser. No. 13/113,638 filed May 23, 2011, now U.S. Pat. No. 8,497,186, which is a divisional of U.S. application Ser. No. 12/410,343 filed Mar. 24, 2009, now U.S. Pat. No. 7,947,601, each of which is incorporated herein by reference in its entirety.

TECHNICAL FIELD

The present disclosure is related to semiconductor devices and methods for forming patterned radiation blocking on a semiconductor device.

BACKGROUND

Microelectronic imaging devices include semiconductor dies having image sensors located on a front surface of the die to receive incoming radiation. The dies also include external contacts or terminals for electrically coupling the sensors to other circuit elements. To prevent the external contacts from interfering with the operation of the sensors or limiting the size and/or location of the sensors, the external contacts at the front surface can be electrically coupled to corresponding external contacts on the back surface of the die by internal interconnects. The internal interconnects can be through-substrate vias (TSVs). The TSVs are formed by (a) making through holes or blind holes in the die that are aligned with the corresponding external contacts, (b) lining the sidewalls of the openings with a dielectric material, and (c) at least partially filling the openings with a conductive material. External interconnect elements such as solder balls or wirebonds can then be attached to the external contacts on the backside to couple the die to external devices.

FIGS. 1A-1D illustrate a process for forming an infrared radiation (IR) blocking layer on a backside of an imager 10 using two separate photo-lithography processes. FIG. 1A illustrates the imager 10 being formed on a microfeature workpiece 100 having a substrate 101 with a front side 103 and a backside 105, a dielectric layer 102 with a first surface 104 and a second surface 106, and a plurality of holes 108 with dielectric liners 109. The imager 10 also has an image sensor 107a at the front side 103 of the substrate 101, integrated circuitry 107b on and/or in the substrate 101, and bond pads 110 at the front side 103. The workpiece 100 also has a conductive redistribution structure 111 having traces 112 on the first surface 104 of the dielectric layer 102, interconnects 114 in the holes 108, and ball-pads 116 at or near the end of respective traces 112.

To form an IR blocking layer over the backside 105 of the substrate 101 and the conductive redistribution structure 111, two separate photo-lithography processes are performed. FIG. 1B illustrates a first photo-lithography process in which a photo-definable IR blocking layer 118 is applied the workpiece 100 to cover the conductive redistribution structure 111 and the exposed portions of the dielectric layer 102. The IR blocking layer 118 is typically applied using a conventional spin-on process in which a liquid IR blocking material is deposited onto the workpiece and the workpiece is rotated to spread the liquid IR blocking material. A first photo-lithography process is performed to pattern openings 119 through the IR blocking layer 118. At the same time the material inside the via may or may not be removed. The openings 119 are patterned such that they expose the ball-pads 116 as shown in FIG. 1C. The IR blocking material is then cured or hardened. FIG. 1C shows the IR blocking material inside the via.

After the ball-pads 116 are exposed, a photoreactive passivation layer 120 is applied to the IR blocking layer 118 as shown in FIG. 1D. The passivation layer 120 is typically a preformed dry resist film positioned on the workpiece in a vacuum environment. The vacuum is then released to pull the passivation layer 120 into the holes 108. The passivation layer may line the hole as shown in FIG. 1D, or it can completely fill the hole. After depositing the passivation layer 120, a second photo-lithography process is performed to form openings 121 in the passivation layer 120 aligned with the ball-pads 116. After the openings 121 are formed, a solder ball or other external connector may be attached to the ball-pads 116.

One drawback of the method shown in FIGS. 1A-1D is that two separate photo-lithography processes are required. Photo-lithography equipment is expensive, and the process of applying, exposing, and developing the layers of IR blocking material and passivation material to form the openings 119 and 120 can be time consuming. As such, the method described with respect to FIGS. 1A-1D is capital intensive and expensive to perform.

Another drawback of the method shown in FIGS. 1A-1D is that photo-patterned IR blocking layers may not adequately block infrared radiation. This problem occurs because spin-on processes may not uniformly coat topographic structures, such as deep holes for through-substrate interconnects, with the liquid IR blocking material. As a result, it is generally desirable to deposit a thick layer of IR blocking material using conventional spin-on processes to adequately cover the surface of the wafer with the IR blocking material. However, because IR blocking material blocks radiation, the IR blocking layer cannot be too thick or else the radiation of the photo-patterning process will not penetrate through the full thickness of the IR blocking layer. Conventional IR blocking layers in microelectronic imagers are accordingly susceptible to allowing infrared radiation to pass through the blocking layer to the imager.

A further drawback of the method described in FIGS. 1A-1D is that photo-definable materials are relatively more expensive than equivalent materials that are not photo-definable. As a result, in addition to the cost of the photo-patterning tool, photo-definable IR blocking layers are relatively expensive.

DETAILED DESCRIPTION

Various embodiments of semiconductor devices and methods for forming patterned IR blocking layers in semiconductor devices are described below. The term "microfeature substrate" is used throughout to include semiconductor substrates and other types of substrates upon which and/or in which semiconductor devices, other types of microelectronic devices, micromechanical devices, data storage elements, read/write components, and other features are fabricated. Microfeature substrates can include one or more layers (e.g., conductive, semiconductive, and/or dielectric) that are situated upon and/or within one another. These layers can include or form a wide variety of electrical components, mechanical components, and/or systems of such components (e.g., integrated circuits, memory devices, processors, imagers, micromechanical systems, etc.). The term "surface" can encompass planar and nonplanar surfaces of a semiconductor substrate with or without patterned and non-patterned features. A person skilled in the relevant art will also understand that the disclosure may have additional embodiments, and that the disclosure may be practiced without several of the details of the embodiments shown and described below with reference to FIGS. 2A-8.

Figure 1A:
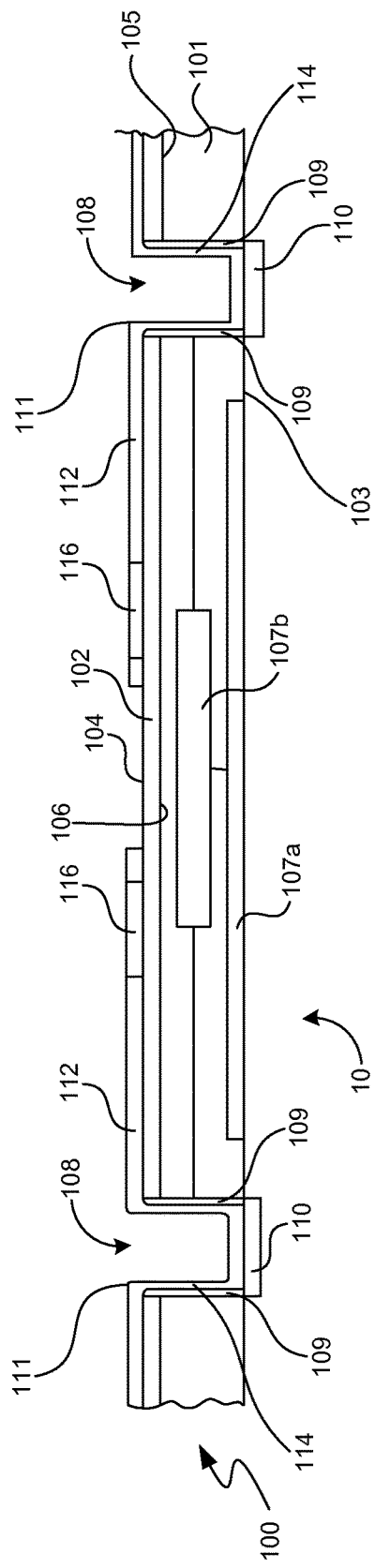
FIGS. 1A-1D are schematic cross-sectional views of various stages in a method for forming a patterned IR blocking layer according to the prior art.
Figure 1B:
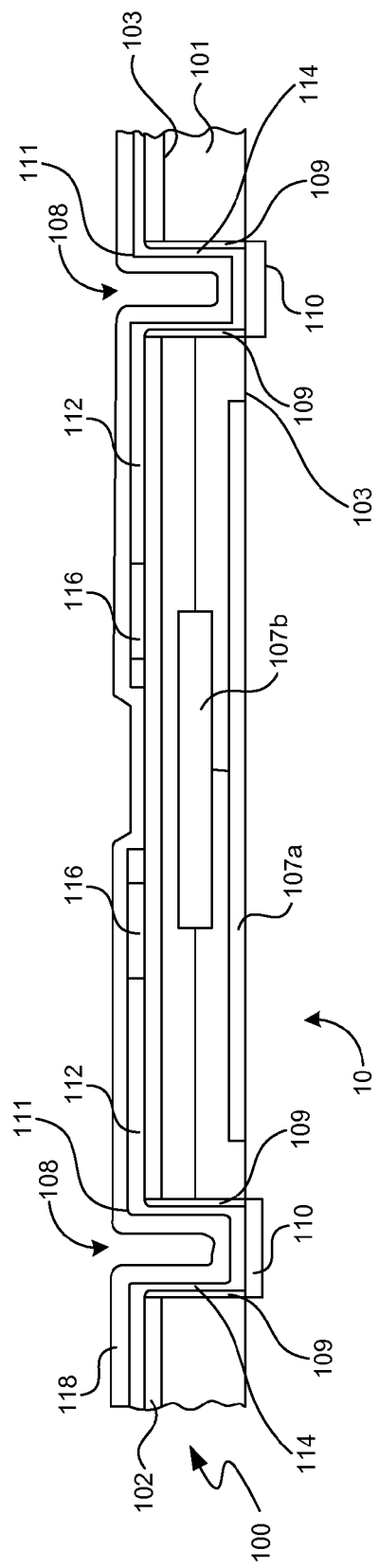
Figure 1C:
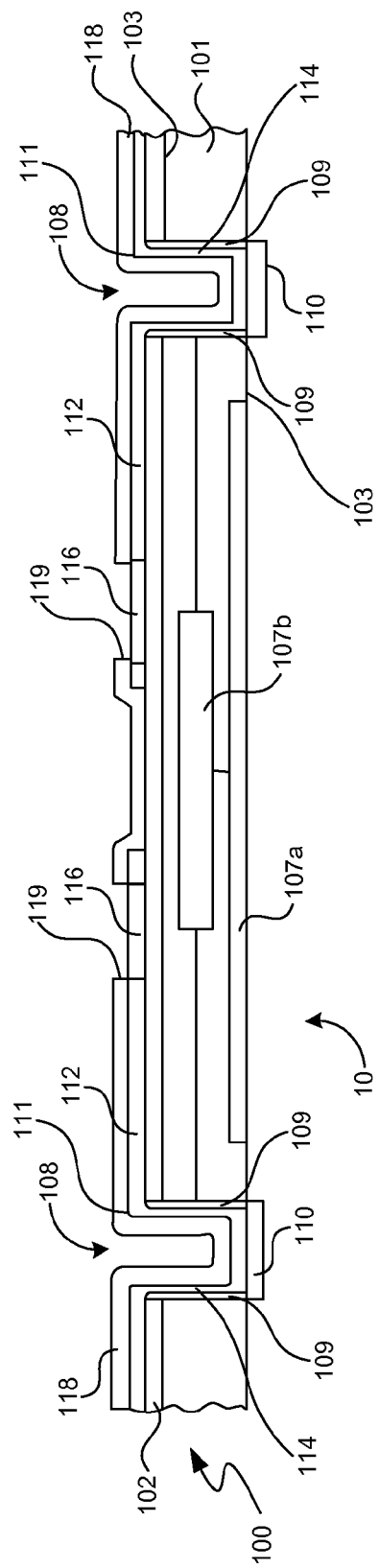
Figure 1D:
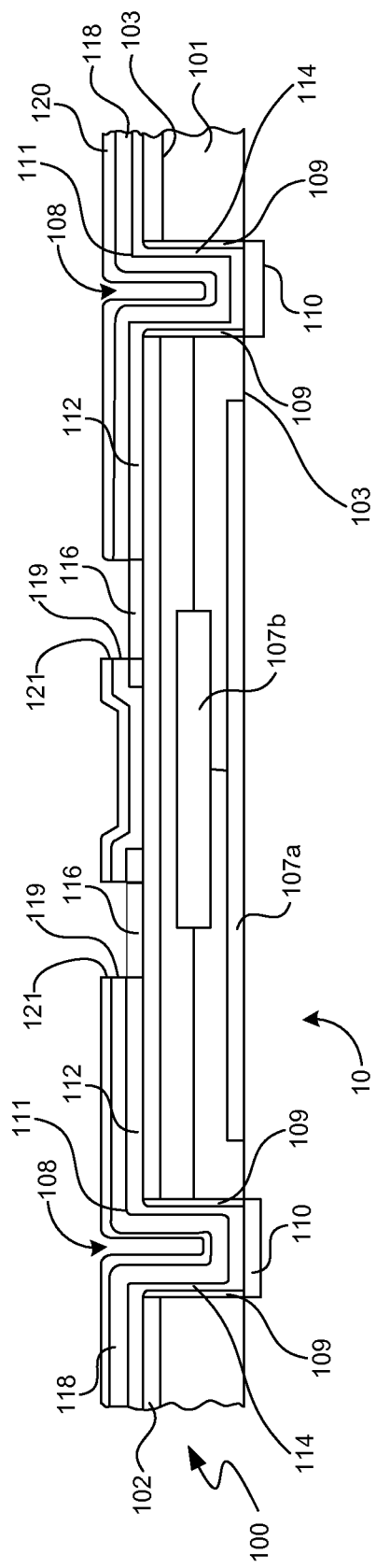
Figure 2A:
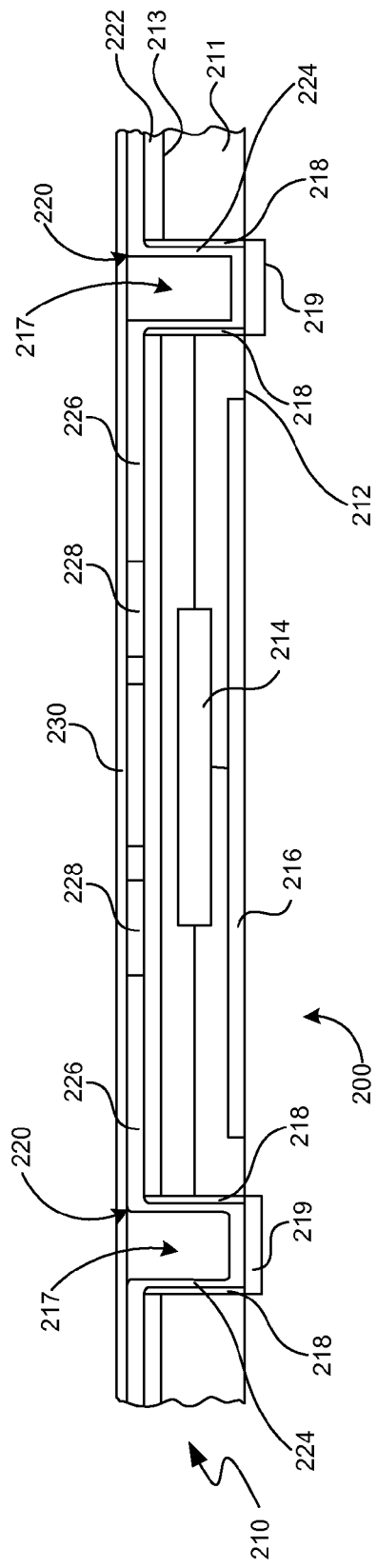
FIGS. 2A-2D are schematic cross-sectional views of various stages in a method for forming patterned IR blocking layers in accordance with several embodiments of the disclosure.

FIGS. 2A-2D illustrate several stages of a process for forming a patterned IR blocking layer on a semiconductor device in accordance with several embodiments of the disclosure. FIG. 2A illustrates a microelectronic device 200, such as a microelectronic imager, and a microfeature workpiece 210 having a semiconductor substrate 211 with a front side 212 and a backside 213. In a typical application, a plurality of individual microelectronic devices 200 are formed on and/or in the microfeature workpiece 210, but for the purposes of clarity only a single microelectronic device 200 is described herein with the understanding that each device on the microfeature workpiece 210 can be the same. The embodiment of the microelectronic device 200 illustrated in FIG. 2A is a microelectronic imager having integrated circuitry 214, an image sensor array 216 electrically coupled to the integrated circuitry 214, and a plurality of holes 217 extending from the front side 212 to the backside 213 of the substrate 211. The side walls of the holes 217 are coated with a dielectric liner 218, and bond pads 219 located at the front side 212 of the substrate 211 cover or otherwise close-off one end of the holes 217. The holes 217 can be formed with known methods such as etching or laser drilling, and the dielectric liners 218 can be formed using known deposition and etching techniques.

At this stage of the process, a redistribution structure 220 has been formed at the backside 213 of the substrate 211. The redistribution structure 220 includes a dielectric layer 222 on the backside 213 of the substrate 211, a plurality of interconnects 224 in the holes 217, a plurality of traces 226 on the dielectric layer 222, and a plurality of pads 228. The interconnects 224 illustrated in FIG. 2A are through-substrate interconnects that extend from the backside of the bond pads 219 to the traces 226. The traces 226 extend laterally from the holes 217 to space the pads 228 apart from one another so that solder balls or other electrical connectors can be formed on the pads 228. The interconnects 224, traces 226, and pads 228 can be formed integrally from a single layer of conductive material, or one or more of these components can be formed separately from the same or different material. For example, the interconnects 224 can be formed from a material that completely fills the holes 217, and the traces 226 and pads 228 can be formed from a different material that is deposited onto the dielectric layer 222 and subsequently etched through a photo-mask. Alternatively, as shown in FIG. 2A, the interconnects 224, traces 226, and pads 228 are formed from a conformal layer of copper or another suitably conductive material by depositing the conformal layer across the dielectric layer 222 and into the holes 217. The conformal layer is then covered with a photo-mask and etched to form the individual interconnects 224, traces 226, and pads 228.

As shown in FIG. 2A, a preformed IR blocking layer 230 is placed on the redistribution structure 220. The IR blocking layer 230 is made from a material that absorbs or otherwise blocks a sufficient amount of infrared radiation. The IR blocking layer 230, for example, has sufficient non-photoreactive properties so that it at least substantially prevents or otherwise inhibits the formation of microfeatures using photolithography or other processes that formed patterns in other layers or the like on the wafer. The IR blocking layer is accordingly at least substantially non-photoreactive (i.e., it is at least substantially not "photo-definable"). As a result, the IR blocking layer 230 is not suitable for being patterned and developed in a photo-lithography process. The materials of the IR blocking layer 230 are accordingly not limited to photo-lithographic materials, but rather the materials of the IR blocking layer 230 can have high IR blocking properties. In some embodiments, for example, the IR blocking layer 230 can be a black polymeric sheet that absorbs all or nearly all of the infrared radiation and/or other selected radiation to which it is exposed. The IR blocking layer 230 is generally a preformed film or laminated structure having a predetermined thickness before it is placed on the microfeature workpiece 210.

Figure 2B:
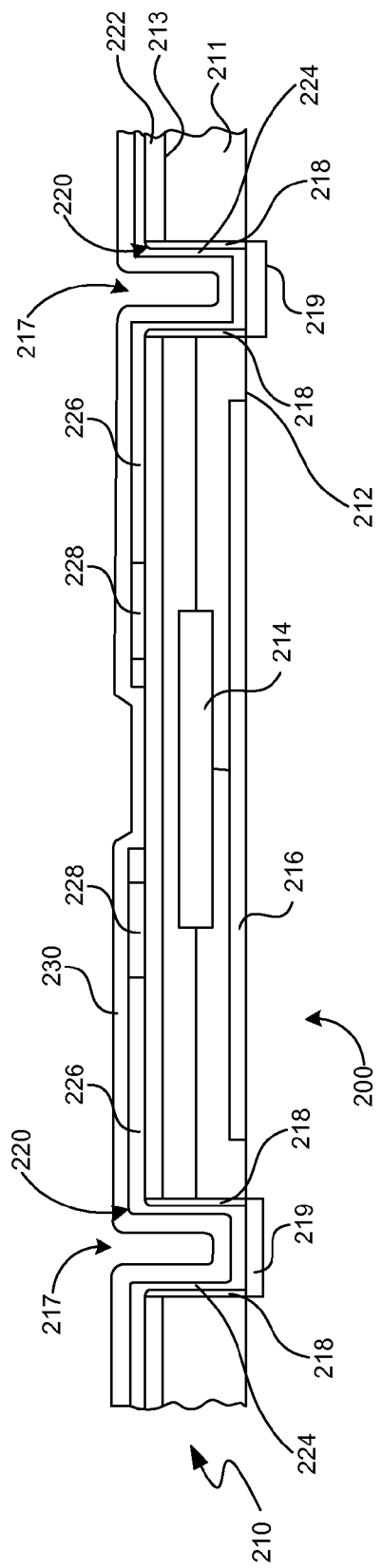

FIG. 2B illustrates a subsequent stage in which the IR blocking layer 230 has been shaped to conform to the topography of the holes 217, traces 226, and pads 228. In one embodiment, the IR blocking layer 230 is placed on the redistribution structure 220 as shown in FIG. 2A in a low-pressure environment (e.g., a vacuum chamber). As the vacuum is released, low-pressure regions remain in the open spaces of the holes 217 and other open spaces between the IR blocking layer 230 and the redistribution structure 220. The IR blocking layer 230 is accordingly drawn into the low-pressure regions until it conforms to the topography of the holes 217 and the redistribution structure 220 as shown in FIG. 2B.

Figure 2C:
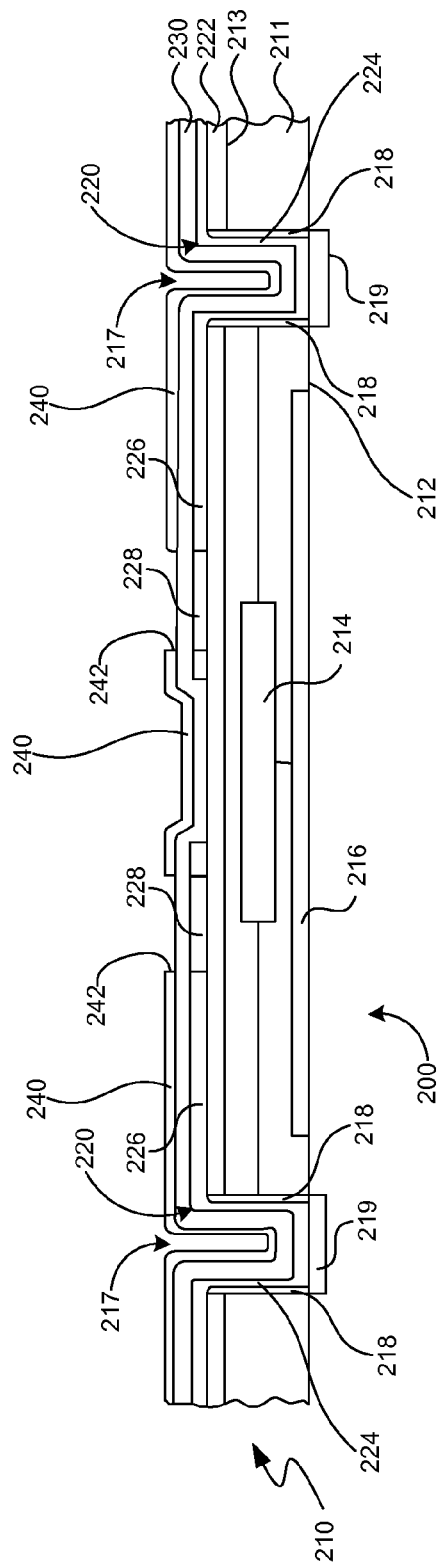

FIG. 2C illustrates a subsequent stage in which a passivation layer 240 is disposed on the IR blocking layer 230. In the embodiment shown in FIG. 2C, the passivation layer 240 is a photo-resist material that is subsequently photo-patterned to form a plurality of apertures 242 aligned with corresponding pads 228. The passivation layer 240 illustrated in FIG. 2C can be a liquid photo-resist disposed onto the IR blocking layer 230 using conventional spin-on processes, or the passivation layer 240 can be a dry resist deposited onto the IR blocking layer 230 after it has been shaped to conform to the topography of the holes 217 and the redistribution structure 220. The dry resist may also completely fill the holes in other embodiments. The IR blocking layer and photo-resist film layer may be made from different materials known in the art in other embodiments.

Figure 2D:
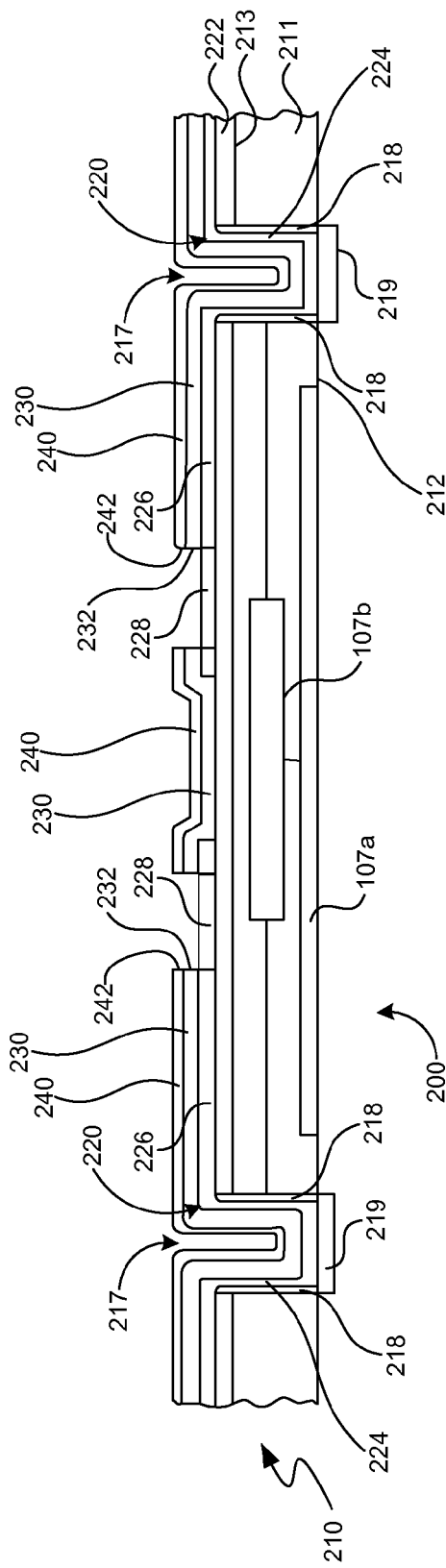

FIG. 2D illustrates a subsequent stage in which openings 232 are formed in the IR blocking layer 230 such that the pads 228 are exposed through the openings 232 and the apertures 242. The openings 230 can be formed by disposing a wet or dry etchant in the apertures 242 to etch the pattern of openings 232 in the IR blocking layer 230. A dry etch process may reduce the thickness of the passivation layer 240 and the IR blocking layer 230 by the same amount. The thickness of passivation and IR blocking layers 240 and 230 are selected to allow the desired thickness to remain on the surface. Solder balls or other electrical connectors can then be connected to the pads 228 to provide backside electrical connections for the individual microelectronic devices 200.

Figure 3A:
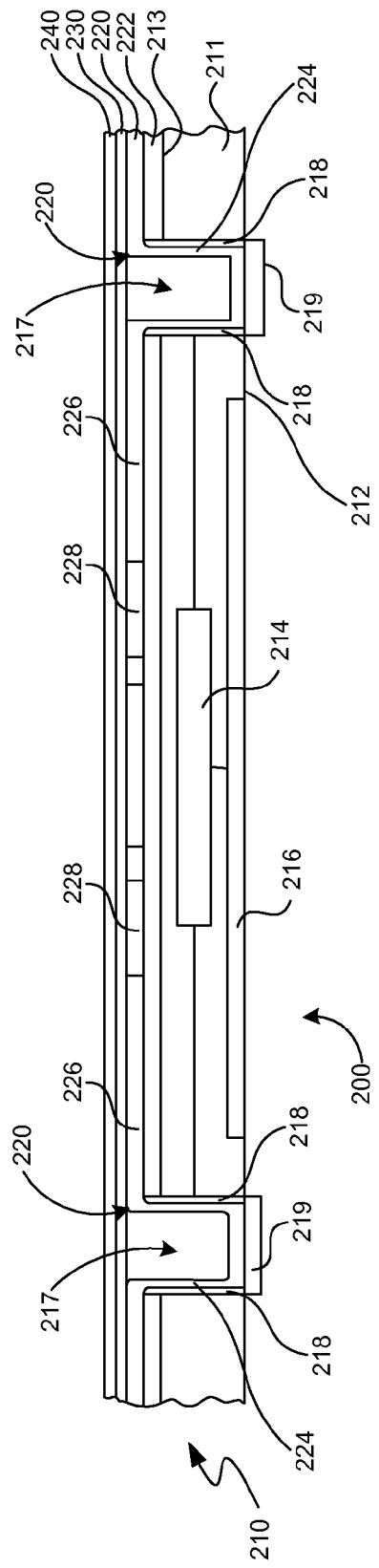
FIGS. 3A and 3B are schematic cross-sectional views of various stages in a method for forming patterned IR blocking layers in accordance with several embodiments of the disclosure.
Figure 3B:
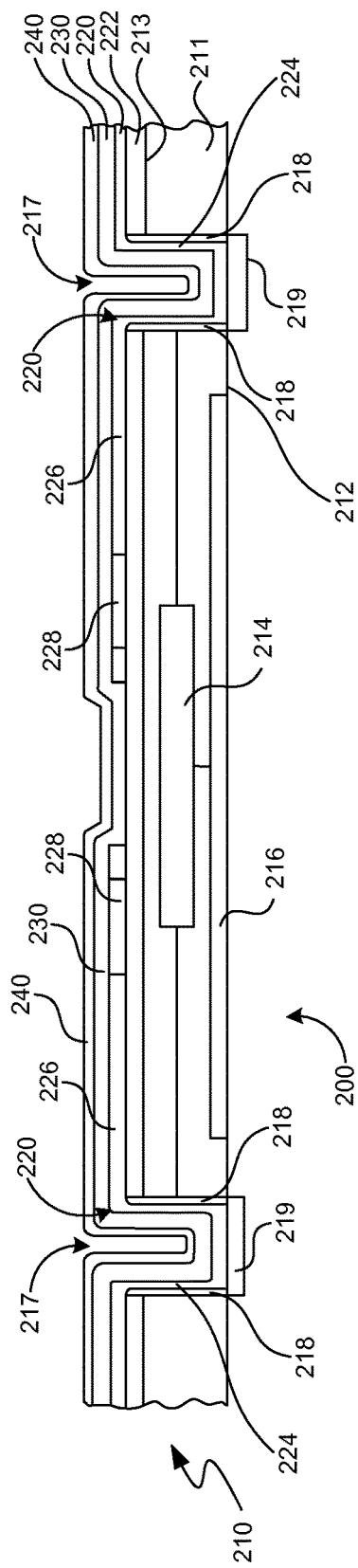

FIGS. 3A and 3B are cross-sectional views illustrating stages of a method in accordance with another embodiment for forming a patterned IR blocking layer on a semiconductor device or other microelectronic device. Like reference numbers refer to like components in FIGS. 2A-3B. Referring to FIG. 3A, this embodiment includes applying the preformed IR blocking layer 230 to the microfeature workpiece 210 and then disposing the passivation layer 240 on the IR blocking layer 230. The embodiment illustrated in FIG. 3A differs from the embodiment illustrated in FIGS. 2B and 2C in that the passivation layer 240 is disposed on the preformed IR blocking layer 230 before the preformed IR blocking layer 230 is shaped to conform to the topography of the redistribution structure 220. The passivation layer 240 can be a dry resist or other suitable resist that can be applied in a low-pressure environment. The embodiment illustrated in FIG. 3A accordingly provides a laminated bi-layer IR blocking structure in which the passivation layer 240 is formed in situ while the IR blocking layer 230 is on the microfeature workpiece 210.

FIG. 3B illustrates a subsequent stage in which the vacuum has been released such that the laminated bi-layer IR blocking structure is drawn into the holes 217 and the other regions between the preformed IR blocking layer 230 and the microfeature workpiece 210. After this stage, apertures can be formed in the passivation layer 240 and then openings can be etched through the IR blocking layer 230 as shown above with respect to FIGS. 2C and 2D.

Figure 4A:
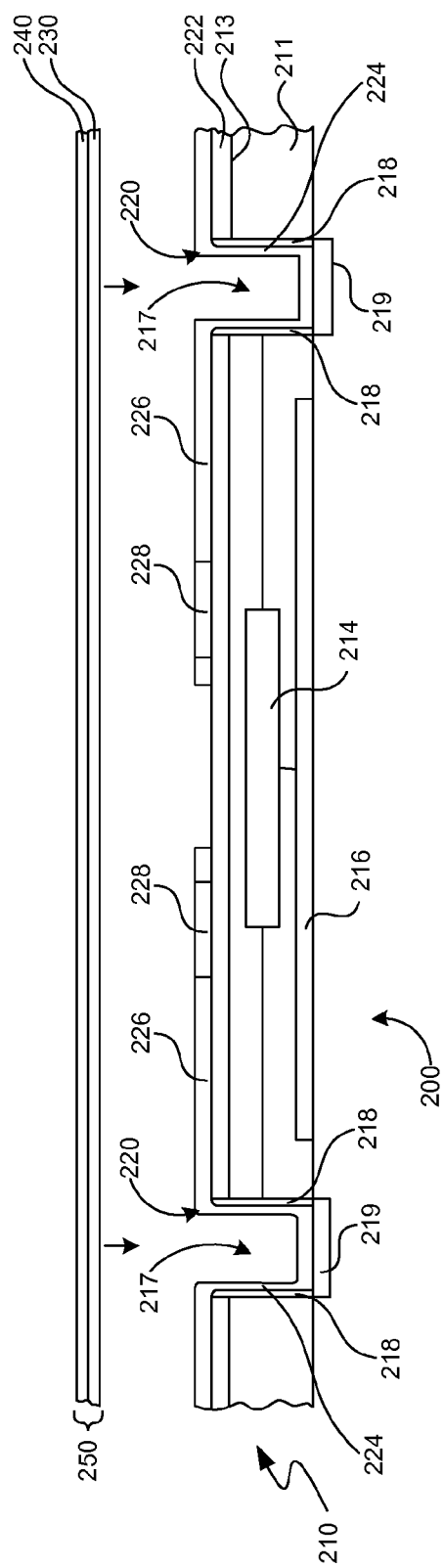
FIGS. 4A-4C are schematic cross-sectional views of various stages in a method for forming patterned IR blocking layers in accordance with additional embodiments of the disclosure.
Figure 4B:
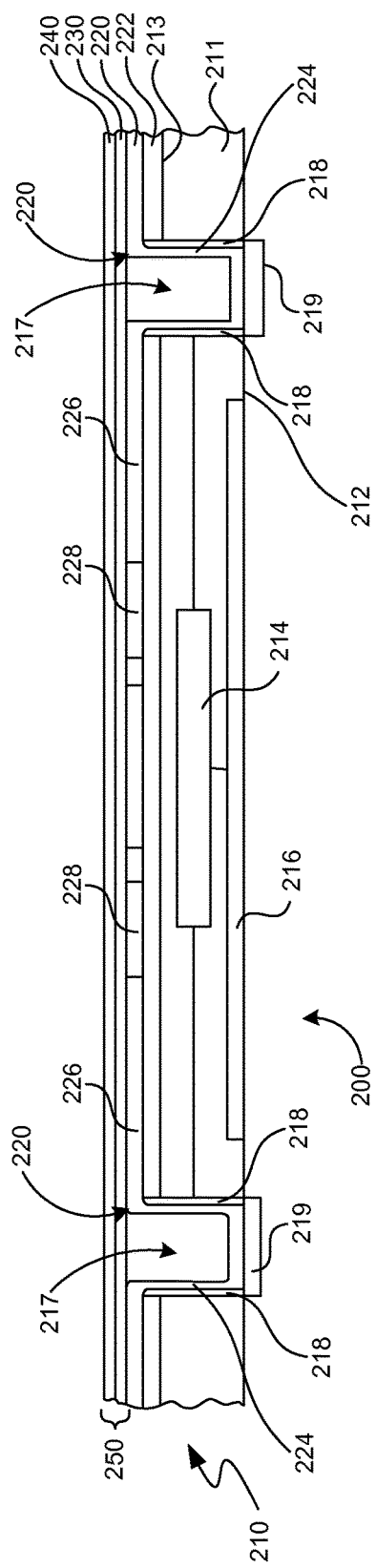
Figure 4C:
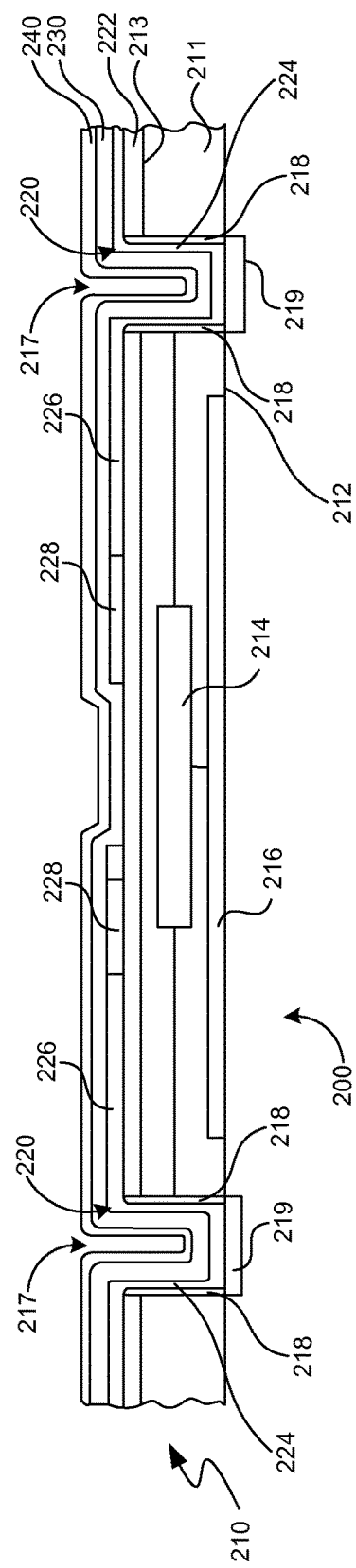

FIGS. 4A-4C illustrate stages of a method for forming patterned IR blocking layers in semiconductor devices or other microelectronic devices in accordance with another embodiment. Like reference numbers refer to like components in FIGS. 2A-4B. Referring to FIG. 4A, a preformed bi-layer IR blocking structure 250 is formed apart from the microfeature workpiece 210. The IR blocking structure 250 is accordingly formed before disposing the IR blocking layer 230 over the redistribution structure 220. The IR blocking structure 250 can include a first preformed sheet having a first thickness and a second preformed sheet laminated to the first preformed sheet. In one embodiment, for example, the IR blocking layer 230 is a first preformed sheet and the passivation layer 240 is a second preformed sheet that is bonded or otherwise laminated to the IR blocking layer 230.

In an alternative embodiment, the IR blocking layer 230 is a preformed sheet and the passivation layer 240 is then formed on the preformed sheet of the IR blocking layer 230. The passivation layer 240, for example, can be a resist that is deposited onto the performed IR blocking layer 230 apart from the microfeature workpiece 210. The IR blocking structure 250 can be cut or otherwise shaped to at least approximately correspond to the size and shape of the microfeature workpiece 210 before the IR blocking structure 250 is placed or otherwise applied to the microfeature workpiece 210.

FIG. 4B illustrates a subsequent stage in which the IR blocking structure 250 is applied to the microfeature workpiece 210 such that the IR blocking layer 230 is disposed on the redistribution structure 220. This process can be performed in a low-pressure environment such that low-pressure regions exist in the holes 217 and other vacant regions between the microfeature workpiece 210 and the IR blocking layer 230. Referring to FIG. 4C, the vacuum can then be released to draw the IR blocking structure 250 into the holes 217 and other low-pressure regions such that the IR blocking structure 250 conforms to the topography of the holes 217 and the redistribution structure 220. As with the other embodiments described above, a plurality of apertures can be formed in the passivation layer 240 and then openings can be etched in the IR blocking layer 230 to expose the pads 228 of the redistribution structure 220.

One feature of embodiments of the systems and methods described above with reference to FIGS. 2A-4B is that only a single photo-lithography process is used to form both the apertures in the passivation layer and the openings in the IR blocking layer. By providing a preformed IR blocking layer and then shaping the preformed IR blocking layer to conform to the redistribution structure, the pads of the redistribution structure can be exposed with only one photo-lithography process. This enables photo-lithography tools to be used for other processes.

Another feature of embodiments of the systems described above with reference to FIGS. 2A-4B is that the IR blocking layer is not photoreactive. As explained above, photo-definable IR blocking layers need to be thin so that the exposure radiation can penetrate the full thickness of the film. If the film is too thick, a pattern of holes will not be formed through the film. At the same time, if the film is too thin, it will not effectively absorb enough IR or other selected radiation. Thus, photo-definable IR blocking layers of the prior art require a balance between being thin enough to work in photo-lithography processes and thick enough to block sufficient radiation. However, the IR blocking layer 230 is not limited to being thin because it is not patterned by a photo-lithography process to form the openings 232 (FIG. 2D). The IR blocking layer 230 can also be made from materials that block all or nearly all of the IR or other selected radiation (e.g., can block potentially at least 90% and more specifically block potentially 95%-99% of the IR or other radiation). Thus, the IR blocking layer 230 can block IR or other selected radiation.

Figure 5:
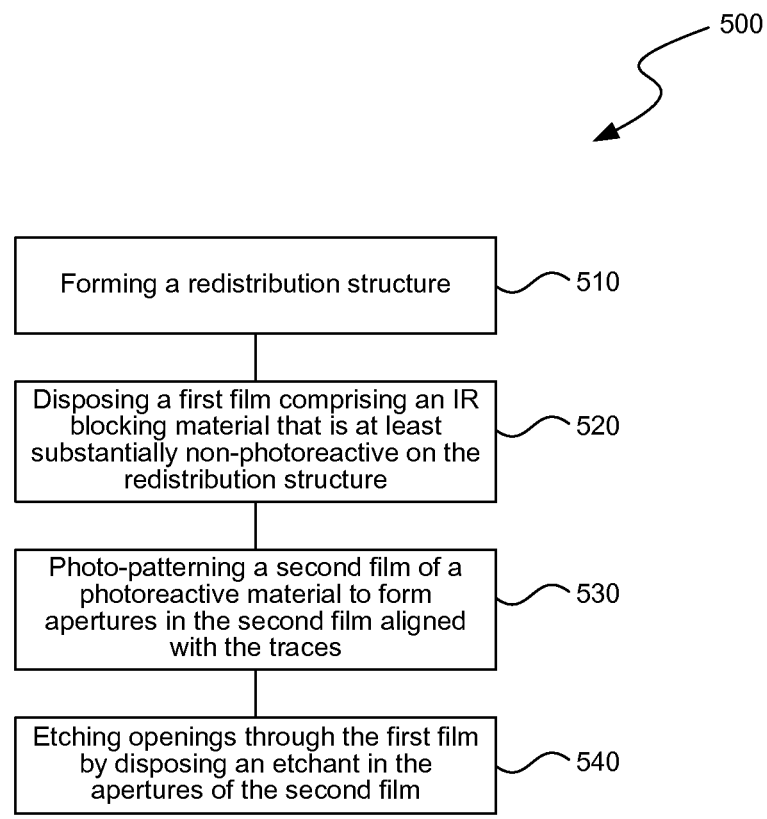
FIG. 5 is a flowchart of a method for forming a patterned IR blocking layer using a preformed IR blocking film in accordance with an embodiment of the disclosure.

FIG. 5 illustrates a flowchart of a method 500 for manufacturing a microelectronic imager having a substrate, an image sensor at a first side of the substrate, integrated circuitry coupled to the image sensor, and a plurality of bond-pads at the first side of the substrate that are electrically coupled to the integrated circuitry. The method 500 comprises forming a redistribution structure having through-substrate interconnects and traces electrically coupled to the through-substrate interconnects (block 510). The through-substrate interconnects extend from corresponding bond-pads to a second side of the substrate, and the traces extend over the second side of the substrate. The method 500 continues by disposing a first film comprising infrared blocking material that is at least substantially non-photoreactive over the traces (block 520). The first film, for example, can be the IR blocking layer 230 described above. The method 500 continues by photo-patterning a second film of a photo-definable material on the first film and thereby exposing portions of the first film aligned with corresponding traces (block 530). The method 500 further includes etching openings at the exposed portions of the first film to expose ball-pads on the traces (block 540).

Another method of manufacturing a microelectronic imager comprises covering the electrical connectors of a redistribution structure with an IR blocking layer that is at least substantially non-photoreactive. This embodiment further comprises forming apertures through a layer of photo-resist on the IR blocking layer. The apertures are aligned with the electrical connectors of the redistribution structure. The method continues by etching openings in the infrared blocking layer through the apertures of the photo-resist layer.

Figure 6:
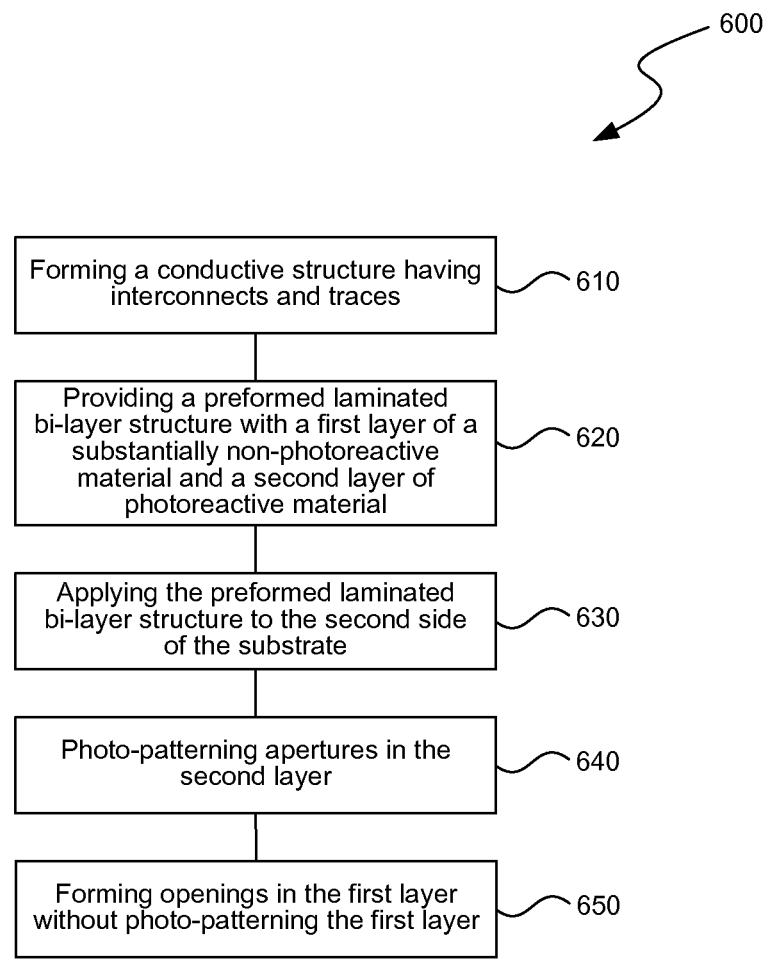
FIG. 6 is a flowchart of another method for forming a patterned IR blocking layer without photo-patterning the IR blocking material in accordance with additional embodiments of the disclosure.

FIG. 6 illustrates an embodiment of a method 600 for fabricating a semiconductor device having a die including a substrate with a first side and a second side, integrated circuitry, and bond-pads located at the first side that are electrically coupled to the integrated circuitry. The method 600 includes forming a conductive structure having interconnects and traces such that the interconnects are electrically coupled to the bond-pads and extend to the second side of the substrate and the traces extend from the interconnects over the second side of the substrate (block 610). The method continues by providing a preformed laminated bi-layer structure that is formed apart from the substrate (block 620). The preformed laminated bi-layer structure can have a first layer of material that is at least substantially non-photoreactive and a second layer of a photoreactive material. The method 600 further includes applying the preformed laminated bi-layer structure to the second side of the substrate such that the preformed laminated bi-layer structure conforms to the topography of the traces and the interconnects (block 630). The method 600 further includes photo-patterning apertures in the second layer of the preformed laminated bi-layer structure that are aligned with ball-pad portions of the traces (block 640), and forming openings in the first layer of the laminated bi-layer structure without photo-patterning the first layer (block 650).

Figure 7:
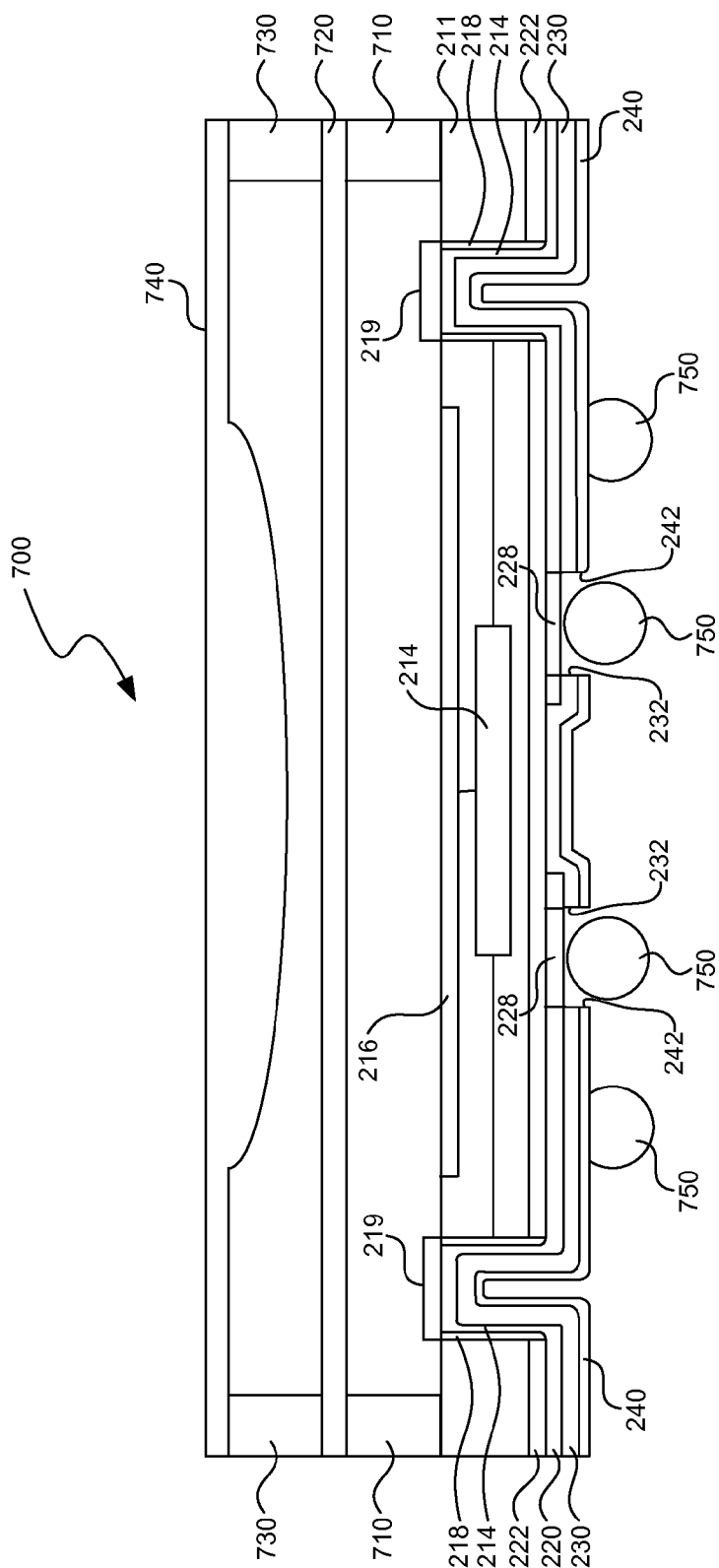
FIG. 7 is a schematic cross-sectional view of a microelectronic imager including a patterned IR blocking layer in accordance with an embodiment of the disclosure.

FIG. 7 is a schematic cross-sectional illustration of a packaged microelectronic imager 700 that includes a backside IR blocking layer composed of a material that is at least substantially non-photoreactive. Like reference numbers refer to like components in FIGS. 2A-4B and FIG. 7. In addition to the components described above, the packaged imager 700 further includes a first standoff 710 attached to the front side of the substrate 211, a cover 720 attached to the first standoff 710, and a second standoff 730 attached to the cover 720. The packaged imager 700 can further include a lens assembly 740 attached to the second standoff 730. The first and second standoffs 710 and 730, the cover 720, and the lens assembly 740 are merely shown for illustrative purposes and are not limited to either their individual configurations or the order in which they are stacked in FIG. 7. In several embodiments, for example, the packaged imager 700 may not include the cover 720 or the lens assembly 740. The packaged imager 700 further includes a plurality of external electrical connectors 750, such as solder balls, attached to the pads 228. As shown in FIG. 7, the two external electrical connectors 750 located toward the center of the packaged imager 700 are positioned through the apertures 242 and openings 232 of corresponding pads 228. The external connectors 750 illustrated in FIG. 7 are similarly connected to pads of the redistribution structure, but the pads at the external connectors 750 are not shown in FIG. 7 because the external connectors are at a different cross-sectional plane through the packaged imager 700.

Other types of semiconductor or other microelectronic devices can include a patterned backside IR blocking layer. For example, a semiconductor device can comprise a die having a substrate with a front side and a backside, an integrated circuit, and a plurality of ball-pads electrically coupled to the integrated circuit. The semiconductor device can further include a conductive redistribution structure having interconnects electrically coupled to the integrated circuit and traces electrically coupling the ball-pads to corresponding interconnects. The semiconductor device can further include an infrared blocking layer on the conductive redistribution structure and a photo-resist layer on the infrared blocking layer. The infrared blocking layer is not photoreactive and has openings aligned with the ball-pads, and the photoresist layer has apertures aligned with the openings through the infrared blocking layer.

Figure 8:
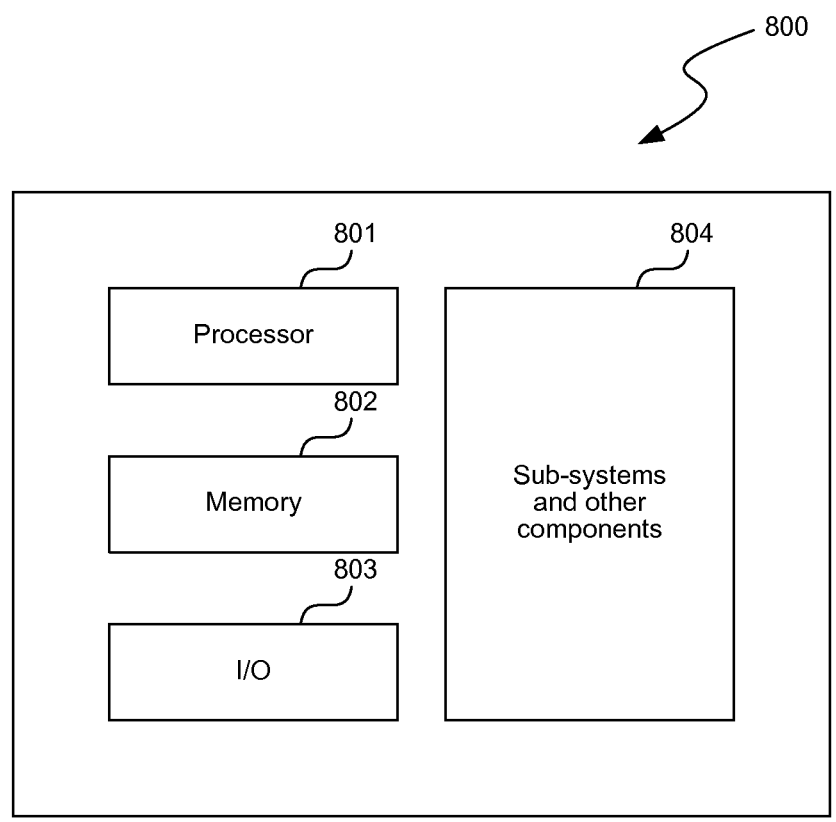
FIG. 8 is a schematic view of a system including microelectronic devices having patterned IR blocking layers in accordance with embodiments of the disclosure.

Any one of the imagers or other types of semiconductor devices described above with reference to FIGS. 2A-7 can be incorporated into larger and/or more complex systems, a representative sample of which is system 800 shown schematically in FIG. 8. The system 800 can include a processor 801, a memory device 802 (e.g., SRAM, DRAM, Flash and/or other memory devices), input/output devices 803, and/or other subsystems or components at 804. The foregoing semiconductor components described above with reference to FIGS. 2A-7 may be included in any of the components shown in FIG. 8. The resulting system 800 can perform any of a wide variety of computing, processing, storage, sensing, imaging, and/or other functions. Accordingly, representative systems 800 can include, without limitation, computers and/or other data processors such as desktop computers, laptop computers, internet appliances, hand-held devices (e.g., palm-top computers, wearable computers, cellular or mobile phones, personal digital assistants, etc.), multi-processor systems, processor-based or programmable consumer electronics, network computers, and mini-computers. Other representative systems 800 can include cameras, light or other radiation sensors, servers and associated server subsystems, and/or display devices. In such systems, individual dies can include imager arrays, such as CMOS imagers. Components of the system 800 may be housed in a single unit or distributed over multiple, interconnected units (e.g., through a communications network). The components of the system 800 can accordingly include local and/or remote memory devices and any of a wide variety of computer-readable media.

From the foregoing, it will be appreciated that specific embodiments of the invention have been described herein for purposes of illustration, but well-known structures and functions have not been shown or described in detail to avoid unnecessarily obscuring the description of the embodiments of the invention. Where the context permits, singular or plural terms may also include the plural or singular term, respectively. Unless the word "or" is associated with an express clause indicating that the word should be limited to mean only a single item exclusive from the other items in reference to a list of two or more items, then the use of "or" in such a list shall be interpreted as including (a) any single item in the list, (b) all of the items in the list, or (c) any combination of the items in the list. Additionally, the term IR blocking layer can mean "radiation blocking" that can at least substantially block a selected radiation other than IR.

From the foregoing, it will be appreciated that specific embodiments described above are for purposes of illustration and that various modifications may be made without deviating from the invention. Aspects of the disclosure described in the context of particular embodiments may be combined or eliminated in other embodiments. Further, while advantages associated with certain embodiments of the disclosure may have been described in the context of those embodiments, other embodiments may also exhibit such advantages, but not all embodiments need necessarily exhibit such advantages to fall within the scope of the disclosure. Accordingly, the present invention is not limited to the embodiments described above, which were provided for ease of understanding, but rather the invention includes any and all other embodiments defined by the claims.

We claim:

1. A method of manufacturing a microelectronic imager having a die including an image sensor, an integrated circuit electrically coupled to the image sensor, and electrical connectors electrically coupled to the integrated circuit, the method comprising:

forming an IR blocking structure by bonding an IR blocking layer and a passivation layer, the IR blocking layer being at least substantially non-photoreactive;

covering the electrical connectors with the IR blocking structure;

forming apertures aligned with the electrical connectors through a layer of photo-resist on the IR blocking structure; and etching openings in the IR blocking structure through the apertures of the photo-resist layer.

2. The method of claim 1 wherein:

the IR blocking layer is a preformed sheet of IR blocking material formed before covering the electrical connectors with the IR blocking layer; and the photo-resist is disposed on the IR blocking structure.

3. The method of claim 2 wherein covering the electrical connectors with the IR blocking structure comprises placing the IR blocking structure on the electrical connectors under a vacuum and releasing the vacuum such that the IR blocking structure conforms to the topography of the electrical connectors.

4. The method of claim 2 wherein the photo-resist is applied to the IR blocking structure before covering the electrical connectors with the IR blocking structure.

5. The method of claim 2 wherein the photo-resist is applied to the IR blocking structure after covering the electrical connectors with the IR blocking structure.

6. The method of claim 1 wherein the IR blocking layer comprises a first preformed sheet of IR blocking material having a first thickness and the passivation layer comprises a second preformed sheet laminated to the first preformed sheet of IR blocking material.

\* \* \* \* \*